United States Patent
Kato

(10) Patent No.: US 7,205,858 B2
(45) Date of Patent: Apr. 17, 2007

(54) TEMPERATURE COMPENSATED PIEZOELECTRIC OSCILLATOR AND ELECTRONIC APPARATUS COMPRISING IT

(75) Inventor: Akira Kato, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 90 days.

(21) Appl. No.: 10/522,562

(22) PCT Filed: Jun. 15, 2004

(86) PCT No.: PCT/JP2004/008338

§ 371 (c)(1),
(2), (4) Date: Jan. 18, 2005

(87) PCT Pub. No.: WO2005/020427

PCT Pub. Date: Mar. 3, 2005

(65) Prior Publication Data

US 2006/0022763 A1    Feb. 2, 2006

(30) Foreign Application Priority Data

Aug. 21, 2003    (JP)    ............... 2003-297729

(51) Int. Cl.
*H03B 5/32* (2006.01)
(52) U.S. Cl. ............ 331/158; 331/116 R; 331/116 FE; 331/176; 331/66

(58) Field of Classification Search ................ 331/158, 331/176, 66, 116 R, 116 FE, 177 V
See application file for complete search history.

(56) References Cited

U.S. PATENT DOCUMENTS 4,412,188 A * 10/1983 Helle et al. ................ 331/176

FOREIGN PATENT DOCUMENTS

| JP | 63-300609 A | 12/1988 |
| JP | 01-081018 U | 5/1989 |
| JP | 6-224635 | 8/1994 |
| JP | 2002-076773 | 3/2002 |
| JP | 2002-135053 | 5/2002 |
| JP | 2004-048643 | 2/2004 |

* cited by examiner

*Primary Examiner*—Arnold Kinkead
(74) *Attorney, Agent, or Firm*—Keating & Bennett, LLP

(57) ABSTRACT

A temperature-compensated piezoelectric oscillator includes an AT-cut quartz crystal resonator, an amplifying circuit connected to one end of the quartz crystal resonator, a varactor diode connected to the other end of the quartz crystal resonator, and a temperature compensation voltage generation circuit connected to ends of the varactor diode via resistors. The temperature compensation voltage generation circuit includes a first voltage generation circuit that includes thermistors and resistors and that is connected to the cathode of the varactor diode, and a second voltage generation circuit that includes a thermistor and resistors and that is connected to the anode of the varactor diode (VD).

23 Claims, 7 Drawing Sheets

TEMPERATURE COMPENSATED PIEZOELECTRIC OSCILLATOR AND ELECTRONIC APPARATUS COMPRISING IT

BACKGROUND OF THE INVENTION

1. Field of the Invention

The present invention relates to piezoelectric oscillators, and more particularly, to a temperature-compensated piezoelectric oscillator that compensates for an oscillation frequency in accordance with an ambient temperature and also relates to an electronic apparatus including the temperature-compensated piezoelectric oscillator.

2. Description of the Related Art

In general, piezoelectric oscillators include a piezoelectric element, such as a crystal strip, that resonates at a predetermined frequency in accordance with an applied voltage and an amplifying circuit for amplifying a resonant signal by the piezoelectric element and for outputting the amplified resonant signal. The resonant frequency of the piezoelectric element, such as a crystal strip, is dependent upon the temperature. Thus, even if the same voltage is applied, the resonant frequency is changed as the temperature of the element changes.

In order to solve this problem, a plurality of temperature-compensated piezoelectric oscillators including a variable capacitance element, such as a varactor diode, that is connected to a piezoelectric element and a temperature compensation voltage generation circuit for changing a voltage applied to the variable capacitance element in accordance with the ambient temperature are known (for example, see Patent Document 1: Japanese Unexamined Patent Application Publication No. 2002-135053; Patent Document 2: Japanese Unexamined Patent Application Publication No. 2002-76773; and Patent Document 3: Japanese Unexamined Patent Application Publication No. 6-224635).

In such temperature-compensated piezoelectric oscillators, a resonant frequency depends on a combined capacitance of a piezoelectric element and a variable capacitance element. Adjusting a voltage applied to the variable capacitance element changes the capacitance of the variable capacitance element. As a result, the combined capacitance is changed, and the resonant frequency is changed. By setting the amount of change in the resonant frequency to compensate for the amount of change in the resonant frequency caused by the temperature of the piezoelectric element, a temperature-compensated piezoelectric oscillator that outputs a high-frequency signal having a constant resonant frequency without being affected by the ambient temperature is provided.

In each of the known temperature-compensated piezoelectric oscillators, an output voltage from a temperature compensation voltage generation circuit is applied to one end of a variable capacitance element (for example, a varactor diode), and the other end of the variable capacitance element is grounded or set to a constant voltage.

Such a temperature-compensated piezoelectric oscillator is installed in a mobile communication apparatus or other suitable apparatus, and is used as a reference signal source. In recent years, a reduction in voltage has been required for mobile communication apparatuses. In accordance with this reduction, a reduction in voltage has also been required for temperature-compensated piezoelectric oscillators, which are used as reference signal sources.

Known temperature compensation voltage generation circuits include a thermistor, which is a thermo-sensitive element, as described in the above-mentioned patent documents. Applying a low voltage to the circuit generates an output voltage corresponding to the temperature, and the voltage is supplied to a variable capacitance element. Normally, due to simplification of the circuit, a power supply voltage of the temperature-compensated piezoelectric oscillator is used as a voltage source for supplying the low voltage to the temperature compensation voltage generation circuit.

Thus, as described above, in accordance with the reduction in the voltage in the temperature-compensated piezoelectric oscillator, the voltage supplied to the temperature compensation voltage generation circuit is reduced. As a result, an output voltage, that is, the maximum value of the voltage supplied to the variable capacitance element is reduced. Thus, the range of the voltage applied to the variable capacitance element is reduced, and the range of possible changes in the capacitance is reduced.

In contrast, although the resonant frequency of a piezoelectric element, such as a quartz crystal resonator, is dependent upon a change in the temperature, the resonant frequency does not depend on the applied voltage. Thus, even if the voltage of the temperature-compensated piezoelectric oscillator is reduced, the amount of change in the resonant frequency with respect to a change in the temperature does not change.

Accordingly, a sufficient temperature compensation for the resonant frequency of the piezoelectric element may not be achieved in the range of the voltage generated from the temperature compensation voltage generation circuit.

SUMMARY OF THE INVENTION

To overcome the problems described above, preferred embodiments of the present invention provide a temperature-compensated piezoelectric oscillator that ensures temperature compensation and that outputs a high-frequency signal having a constant resonant frequency even when a power supply voltage is reduced, and an electronic apparatus including such a novel temperature-compensated piezoelectric oscillator.

According to a preferred embodiment of the present invention, in a temperature-compensated piezoelectric oscillator including a piezoelectric element, an amplifying circuit connected to one end of the piezoelectric element, a variable capacitance element connected the other end of the piezoelectric element, and a compensation voltage generation circuit for applying a voltage corresponding to a temperature to the variable capacitance element, the compensation voltage generation circuit includes a first voltage generation circuit for applying a first voltage to one end of the variable capacitance element that is variable depending upon an ambient temperature and second voltage generation circuit for applying a second voltage to the other end of the variable capacitance element that is variable depending upon the ambient temperature in a direction opposite to the first voltage.

With this structure, a voltage that is variable depending upon the ambient temperature and that is in accordance with a potential difference between the first voltage generated by the first voltage generation circuit and the second voltage generated by the second voltage generation circuit is applied to the variable capacitance element connected to the piezoelectric element. Thus, by setting the range of possible voltages generated by the first voltage generation circuit to be different from the range of possible voltages generated by the second voltage generation circuit, a voltage change depending upon the temperature in a wider voltage range can be applied to the variable capacitance element, as compared to a case where one end of the variable capacitance element is set at a constant voltage. Accordingly, the capacitance range of the variable capacitance element is increased, and the capacitance changes depending upon the ambient temperature. As a result, even if a power supply voltage is reduced, the capacitance range is not reduced, and the capacitance greatly changes depending upon the temperature in the capacitance range. By setting the amount of change in the capacitance caused by the temperature to correspond to the amount of change in the resonant frequency caused by the temperature of the piezoelectric element, the resonant frequency of a resonant circuit including the piezoelectric element and the variable capacitance element is compensated for.

Also, each of the first and second voltage generation circuits preferably includes at least one thermo-sensitive element and a plurality of resistance elements.

The thermo-sensitive element is preferably a thermistor.

With this structure, each of the first and second voltage generation circuits, which applies a voltage to the variable capacitance element, is defined by a simple analog network including the thermistor and the resistors.

Preferably, the temperature-compensated piezoelectric oscillator further includes a temperature compensation data generation circuit for detecting the ambient temperature and for generating temperature compensation data corresponding to the detected temperature. Each of the first and second voltage generation circuits includes a DA converter for converting the temperature compensation data in a digital format into an analog signal.

With this structure, the temperature compensation data generation circuit stores temperature compensation data corresponding to a detected temperature in advance, and the temperature compensation data corresponding to the detected temperature is output to each of the first and second voltage generation circuits. Each of the first and second voltage generation circuits converts the temperature compensation data in the digital format into a voltage signal in an analog format, and applies the voltage signal to the variable capacitance element. The capacitance of the variable capacitance element changes in accordance with a potential difference between the voltage signal applied from the first voltage generation circuit and the voltage signal applied from the second voltage generation circuit. Since the temperature compensation data corresponds to the amount of change in the resonant frequency due to the temperature of the piezoelectric element, the resonant frequency of the resonant circuit including the piezoelectric element and the variable capacitance element is appropriately compensated for.

The piezoelectric element is preferably an AT-cut quartz crystal resonator.

The variable capacitance element is preferably a variable capacitance diode (varactor diode).

According to another preferred embodiment of the present invention, an electronic apparatus includes the above-described temperature-compensated piezoelectric oscillator.

As described above, according to various preferred embodiments of the present invention, voltages that are variable depending upon the temperature in opposite directions from each other are applied from corresponding voltage generation circuits to corresponding ends of the variable capacitance element, which affects the oscillation frequency. Thus, a temperature-compensated piezoelectric oscillator that ensures temperature compensation of an oscillation frequency and that outputs a high-frequency signal whose oscillation frequency does not depend upon the temperature even when the power supply voltage is reduced is provided.

In addition, according to preferred embodiments of the present invention, since each of the circuits for generating a temperature compensation voltage is defined by a simple analog circuit including only a thermistor and resistors, the temperature-compensated piezoelectric oscillator has a simple structure.

According to various preferred embodiments of the present invention, temperature compensation data corresponding to the ambient temperature is stored in advance and is input to different DA converters to be converted into voltage signals, and the voltage signals are applied to ends of the variable capacitance element. Thus, a temperature-compensated piezoelectric oscillator that ensures temperature compensation of an oscillation frequency and that outputs a high-frequency signal whose oscillation frequency does not depend on the temperature even when the power supply voltage is reduced is provided.

Also, according to preferred embodiments of the present invention, by providing the temperature-compensated piezoelectric oscillator, an electronic apparatus which stably operates at a low power supply voltage without being affected by the ambient temperature and the operating temperature is provided.

Other features, elements, steps, characteristics and advantages of the present invention will become more apparent from the following detailed description of preferred embodiments with reference to the attached drawings.

DETAILED DESCRIPTION OF PREFERRED EMBODIMENTS

A temperature-compensated piezoelectric oscillator according to a first preferred embodiment of the present invention will be described with reference to FIGS. 1 and 2.

Figure 1:
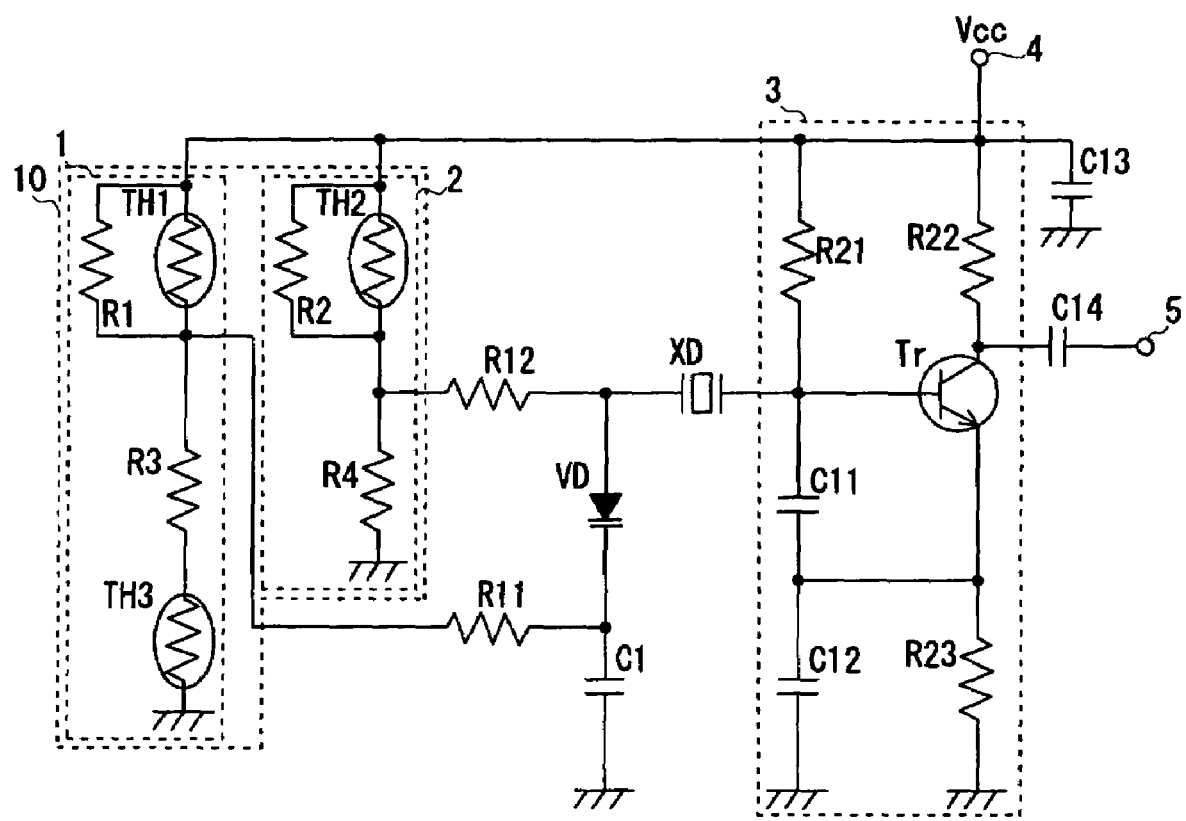
FIG. 1 is an equivalent circuit diagram showing the structure of a temperature-compensated piezoelectric oscillator according to a first preferred embodiment of the present invention.

FIG. 1 is an equivalent circuit diagram of the temperature-compensated piezoelectric oscillator according to the present preferred embodiment.

As shown in FIG. 1, the temperature-compensated piezoelectric oscillator preferably includes an AT-cut quartz crystal resonator (hereinafter, simply referred to as a "quartz crystal resonator") XD, which is a piezoelectric element, an amplifying circuit 3 connected to one end of the quartz crystal resonator XD, a varactor diode VD, which is a variable capacitance element, connected the other end of the quartz crystal resonator XD, and a temperature compensation voltage generation circuit 10. Two outputs from the temperature compensation voltage generation circuit 10 are connected to ends of the varactor diode VD via resistors R11 and R12, respectively.

The temperature compensation voltage generation circuit 10 includes a first voltage generation circuit 1 connected to the resistor R11 and a second voltage generation circuit 2 connected to the resistor R12. Each of the first and second voltage generation circuits 1 and 2 is connected to a power supply voltage (Vcc) terminal 4 and is grounded.

The first voltage generation circuit 1 includes a parallel circuit connected to the Vcc terminal 4 and including a resistor R1 and a thermistor TH1, which is a thermo-sensitive element, a resistor R3, and a thermistor TH3. The resistor R3 and the thermistor TH3 are connected in series with the parallel circuit, and one end of the thermistor TH3 is grounded. Also, the connection point of the resistor R3 and the parallel circuit, which includes the resistor R1 and the thermistor TH1, is connected to the cathode of the varactor diode VD via the resistor R1.

The second voltage generation circuit 2 includes a parallel circuit connected to the Vcc terminal 4 and including a resistor R2 and a thermistor TH2, which is a thermo-sensitive element, and a resistor R4. The resistor R4 is connected in series with the parallel circuit, and one end of the resistor R4 is grounded. Also, the connection point of the resistor R4 and the parallel circuit, which includes the resistor R2 and the thermistor TH2, is connected to the anode of the varactor diode VD via the resistor R12.

The anode of the varactor diode VD is connected to the quartz crystal resonator XD. The cathode of the varactor diode VD is grounded via a high-frequency by-pass capacitor C1.

The base of an NPN transistor Tr in the amplifying circuit 3 is connected to the quartz crystal resonator XD, the collector of the transistor Tr is connected to the Vcc terminal 4 via a resistor R22, and the emitter of the transistor Tr is grounded via a resistor R23 and a capacitor C12. Also, a feedback capacitor C11 is connected between the emitter and the base of the transistor Tr. A resistor R21 for supplying a bias current is connected between the base of the transistor Tr and the Vcc terminal 4. Also, the collector of the transistor Tr is connected to an output terminal 5 via a capacitor C14. Also, the Vcc terminal 4 is RF-grounded via a capacitor C13. As a result, the transistor Tr has a negative resistance at a resonant frequency of the quartz crystal resonator XD.

The first voltage generation circuit 1 of the temperature compensation voltage generation circuit 10 applies a voltage signal that divides a power supply voltage Vcc with a division ratio between the parallel circuit including the resistor R1 and the thermistor TH1 and the series circuit including the resistor R3 and the thermistor TH3 to the cathode of the varactor diode VD via the resistor R11. In contrast, the second voltage generation circuit 2 applies a voltage signal that divides the power supply voltage Vcc with a division ratio between the resistor R4 and the parallel circuit including the resistor R2 and the thermistor TH2 to the anode of the varactor diode VD via the resistor R12.

The varactor diode VD functions as a capacitance element whose capacitance changes in accordance with a potential difference between the voltage from the second voltage generation circuit 2 and the voltage from the first voltage generation circuit 1.

An AT-cut quartz crystal resonator is preferably used as the quartz crystal resonator XD. The resonant frequency of the quartz crystal resonator XD changes based on a cubic function with respect to the ambient temperature. Also, the capacitance of the quartz crystal resonator XD, the capacitance of the varactor diode VD, and the capacitance of the capacitor C1 define a resonant circuit. The quartz crystal resonator XD resonates at a resonant frequency corresponding to a combined capacitance of these elements, together with the amplifying circuit 3.

The transistor Tr of the amplifying circuit 3 operates at the power supply voltage Vcc, oscillates together with the above-mentioned resonant circuit, and outputs an oscillation signal to the output terminal 5.

In accordance with a change in the ambient temperature, the voltage level of a voltage signal output from the first voltage generation circuit 1 and the voltage level of a voltage signal output from the second voltage generation circuit 2 are changed.

Figure 2A:
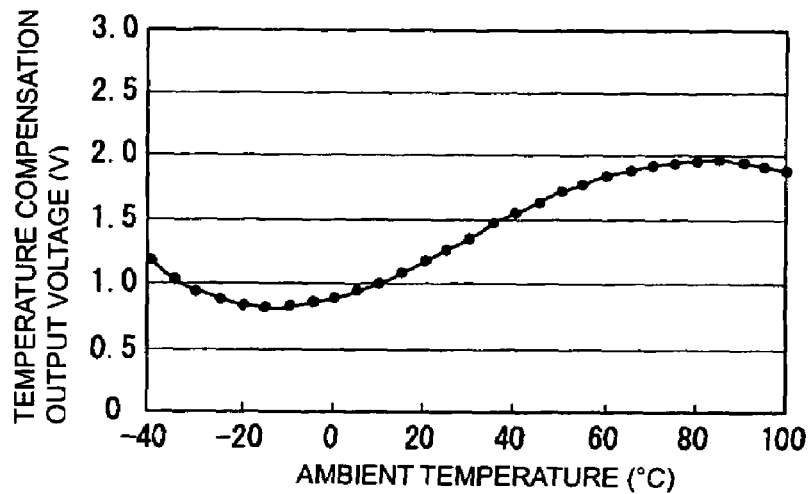
FIG. 2 includes a graph showing the temperature dependency of a temperature compensation output voltage (potential difference) of a temperature compensation voltage generation circuit in the temperature-compensated piezoelectric oscillator shown in FIG. 1, a graph showing the temperature dependency of a temperature compensation output voltage of a temperature compensation voltage generation circuit in a known temperature-compensated piezoelectric oscillator, and an equivalent circuit diagram showing the temperature compensation voltage generation circuit in the known temperature-compensated piezoelectric oscillator.
Figure 2B:
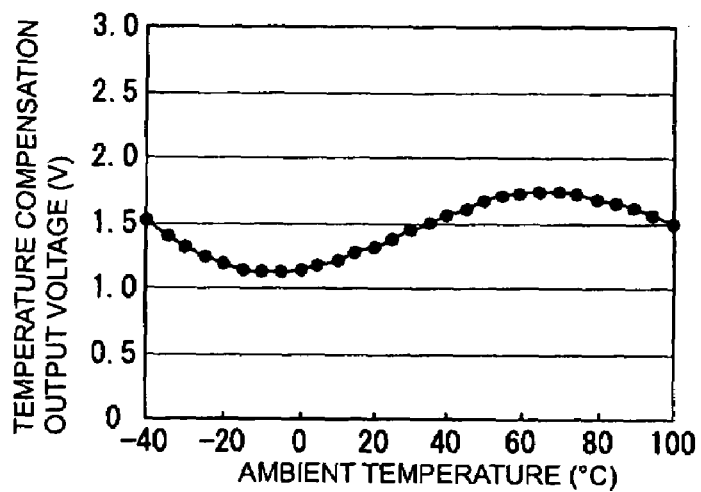
Figure 2C:
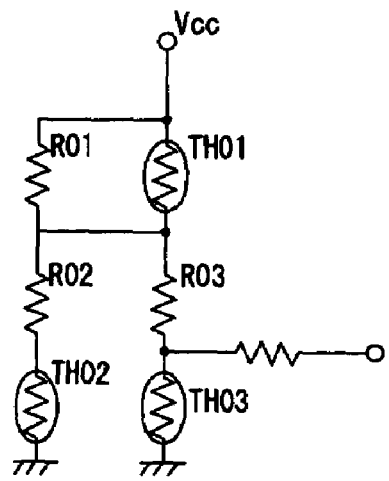

FIG. 2(a) is a graph showing the temperature dependency of a temperature compensation output voltage (potential difference), that is, a voltage applied between the cathode and the anode of the varactor diode VD, of the temperature compensation voltage generation circuit in the temperature-compensated piezoelectric oscillator shown in FIG. 1. FIG. 2(b) is a graph showing the temperature dependency of a temperature compensation output voltage, that is, a voltage applied between the cathode and the anode of a varactor diode VD, of a temperature compensation voltage generation circuit in a known temperature-compensated piezoelectric oscillator. FIG. 2(c) is an equivalent circuit diagram of the temperature compensation voltage generation circuit in the known temperature-compensated piezoelectric oscillator. FIG. 2(a) shows simulation results in a case where, in FIG. 1, the resistances of the resistors are set as: R1=30 kΩ, R2=20 kΩ, R3=1 kΩ, and R4=1 kΩ, where the resistances of the thermistors at 25° C. are set as: TH1=2.31 kΩ, TH2=46.2 kΩ, and TH3=462 Ω, where the B constant of each of the thermistors is set to about between 3000 and 4000, and where Vcc is set to 3V. Also, FIG. 2(b) shows simulation results in a case where, in FIG. 2(c), the resistances of the resistors are set as: R01=30 kΩ, R02=10 kΩ, and R03=10 kΩ, where the resistances of the thermistors at 25° C. are set as: TH1=18.5 kΩ, TH2=1.24 kΩ, and TH3=201 kΩ, where the B constant of each of the thermistors is preferably set to between 3000 and 4000, and where Vcc is set to 3V.

Accordingly, as shown in FIG. 2, even if the same power supply voltage Vcc is supplied, the use of the temperature compensation voltage generation circuit according to this preferred embodiment increases the range of an output potential difference to about 1.2 V, as compared with the range of the output potential difference, which is about 0.7 V, in the known example. In other words, even if a power supply voltage Vcc is reduced, a reduction in the range of the voltage (potential difference) applied to a varactor diode is suppressed. This is because two output voltages from the temperature compensation voltage generation circuit 10 vary in opposite directions from each other at least in a portion of a temperature range.

Since the varactor diode VD functions as a capacitance element whose capacitance is in accordance with the above-described potential difference, a wider range of capacitance than the known example is achieved. In other words, the above-described structure of the temperature compensation voltage generation circuit suppresses a reduction in the range of the capacitance of the varactor diode VD even when the power supply voltage is reduced.

Consequently, the combined capacitance of the resonant circuit including the quartz crystal resonator XD, the varactor diode VD, and the capacitor C1 substantially changes, and the changed combined capacitance operates so as to substantially change the resonant frequency of the resonant circuit.

In contrast, since the quartz crystal resonator XD originally has temperature dependency, the resonant frequency changes in accordance with a change in the ambient temperature, as described above.

The resistors and the thermistors of the temperature compensation voltage generation circuit are set in advance such that the amount of change in the resonant frequency due to the amount of change in the capacitance of the varactor diode VD and the amount of change in the resonant frequency due to a change in the temperature of the quartz crystal resonator XD compensate for each other. Thus, even if the power supply voltage is reduced, the change in the resonant frequency is suppressed. In other words, a high-frequency signal having a stable oscillation frequency without depending on the ambient temperature is output.

Figure 3:
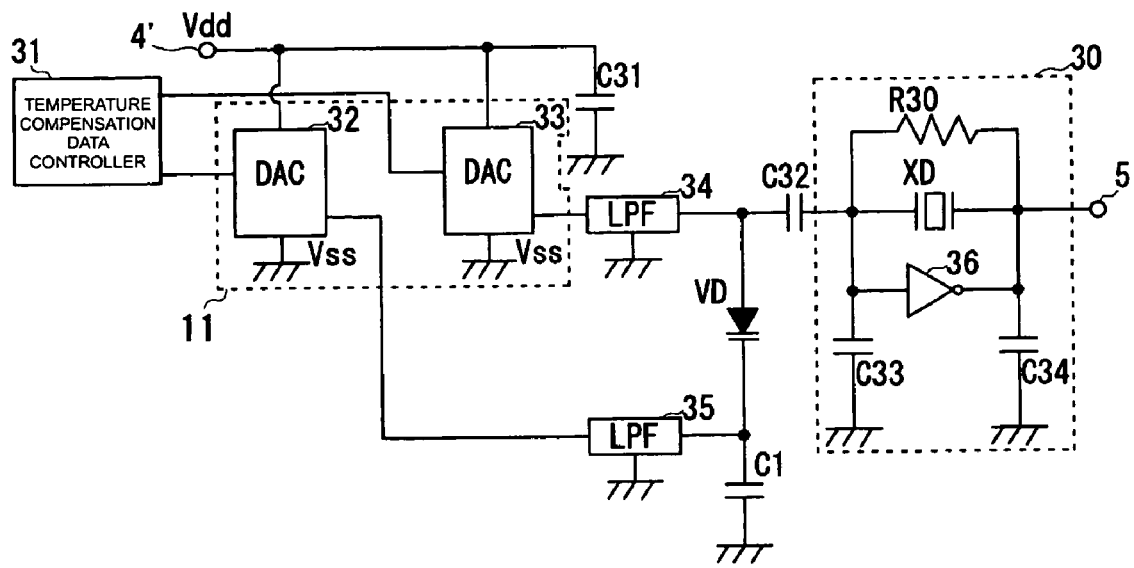
FIG. 3 is an equivalent circuit diagram of a temperature-compensated piezoelectric oscillator according to a second preferred embodiment of the present invention.

A temperature-compensated piezoelectric oscillator according to a second preferred embodiment will be described with reference to FIG. 3. FIG. 3 is an equivalent circuit diagram of the temperature-compensated piezoelectric oscillator according to this preferred embodiment.

As shown in FIG. 3, the temperature-compensated piezoelectric oscillator preferably includes a quartz crystal resonator XD, an amplifying circuit 30 including the quartz crystal resonator XD, a varactor diode VD, which is a variable capacitance element, connected to the quartz crystal resonator XD via a capacitor C32, and a temperature compensation voltage generation circuit 11. Two outputs from the temperature compensation voltage generation circuit 11 are connected to ends of the varactor diode VD via low pass filters LPF34 and LPF35, respectively.

The temperature compensation voltage generation circuit 11 includes a first DA converter 32 connected to the low pass filter LPF35 and a second DA converter 33 connected to the low pass filter LPF34. Each of the first DA converter 32 and the second DA converter 33 is connected to a driving voltage (Vdd) terminal 4'. Also, each of the first DA converter 32 and the second DA converter 33 is connected to a temperature compensation data controller 31 and is grounded (Vss).

The anode of the varactor diode VD is connected to the quartz crystal resonator XD of the amplifying circuit 30 via the capacitor C32 and is connected to the low pass filter LPF34. The cathode of the varactor diode VD is grounded via a high-frequency by-pass capacitor C1 and is connected to the low pass filter LPF35.

In the amplifying circuit 30, the quartz crystal resonator XD, an inverter 36, and a resistor R30 are connected in parallel with each other. The parallel connection points are grounded via capacitors C33 and C34, respectively. Also, an output side of the amplifying circuit 30 (an output side of the inverter 36) is connected to an output terminal 5. Here, the above-mentioned Vdd and Vss are used as power sources for an IC including the inverter 36.

The temperature compensation data controller 31 stores temperature compensation data corresponding to the ambient temperature in a memory in advance. The temperature compensation data controller 31 reads the temperature compensation data from the memory in accordance with a temperature detected by a temperature detection unit, and outputs the temperature compensation data to the DA converter 32 and the DA converter 33. The temperature compensation data determines a voltage (potential difference) to be applied to the ends of the varactor diode VD in accordance with the temperature dependency of the resonant frequency of the quartz crystal resonator XD in the amplifying circuit 30, and data to be output to the DA converter 32 and data to be output to the DA converter 33 are stored.

When the temperature compensation data controller 31 outputs temperature compensation data corresponding to a detected temperature to the DA converter 32 and the DA converter 33 of the temperature compensation voltage generation circuit 11, the DA converter 32 and the DA converter 33 digital-to-analog convert the corresponding temperature compensation data, and output the converted temperature compensation data as voltage signals in an analog format. These voltage signals are applied to the ends of the varactor diode VD via the low pass filters LPF34 and LPF35, respectively.

The capacitance of the varactor diode VD changes in accordance with a difference (potential difference) between the voltage signal from the DA converter 33 and the voltage signal from the DA converter 32, and functions as a capacitance element.

An AT-cut crystal strip is preferably used as the quartz crystal resonator XD of the amplifying circuit 30. The resonant frequency of the quartz crystal resonator XD changes based on a cubic function with respect to the ambient temperature. Since the resonant frequency is affected by the capacitance of the varactor diode, changing the capacitance in accordance with a temperature suppresses a variation in the resonant frequency due to the ambient temperature. In other words, temperature compensation data stored in advance in the temperature compensation data controller 31 is set such that a variation in the resonant frequency of the quartz crystal resonator XD is suppressed by the capacitance of the varactor diode VD in accordance with a detected temperature. Thus, a high-frequency signal having a constant oscillation frequency without depending on the temperature is output.

Although the low pass filters LPF34 and LPF35 are provided at the output sides of the DA converter 32 and the DA converter 33 in this preferred embodiment, the low pass filters LPF34 and LPF35 may be omitted.

A temperature-compensated piezoelectric oscillator according to a third preferred embodiment will be described with reference to FIGS. 4 and 5.

Figure 4:
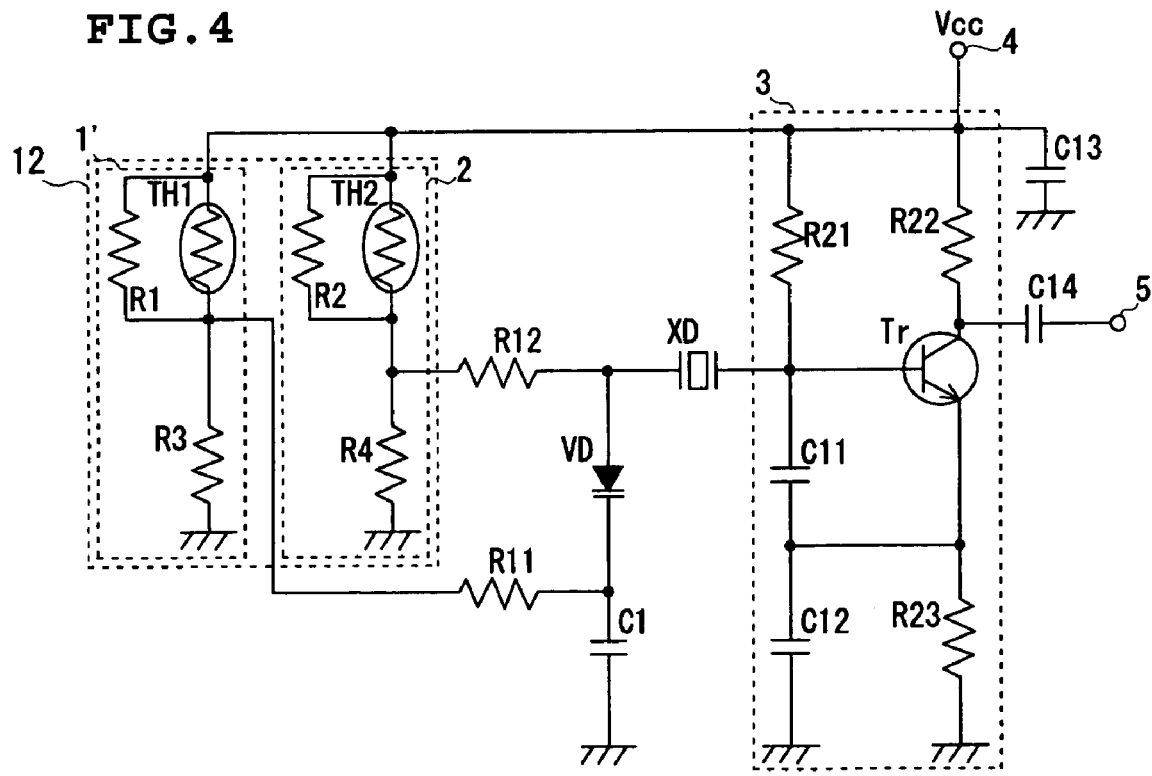
FIG. 4 is an equivalent circuit diagram of a temperature-compensated piezoelectric oscillator according to a third preferred embodiment of the present invention.

FIG. 4 is an equivalent circuit diagram of the temperature-compensated piezoelectric oscillator according to this preferred embodiment.

The temperature-compensated piezoelectric oscillator shown in FIG. 4 preferably has the same structure as the temperature-compensated piezoelectric oscillator shown in FIG. 1 with the exception that the first voltage generation circuit 1 of the temperature-compensated piezoelectric oscillator shown in FIG. 1 is replaced with a first voltage generation circuit 1'. In the first voltage generation circuit 1', the thermistor TH3 of the first voltage generation circuit 1 shown in FIG. 1 is omitted.

Figure 5:
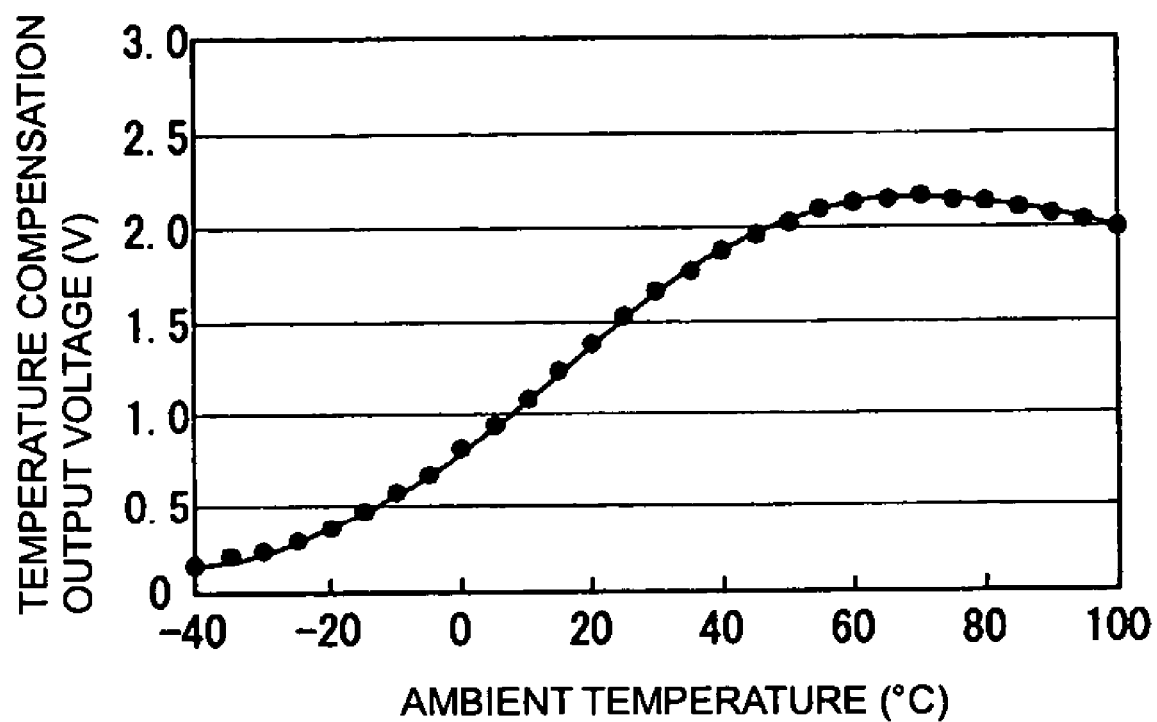
FIG. 5 is a graph showing the temperature dependency of a temperature compensation output voltage (potential difference) of a temperature compensation voltage generation circuit in the temperature-compensated piezoelectric oscillator shown in FIG. 4.

FIG. 5 is a graph showing the temperature dependency of a temperature compensation output voltage (potential difference) of the temperature compensation voltage generation circuit of the temperature-compensated piezoelectric oscillator shown in FIG. 4. FIG. 5 shows simulation results in a case where, in FIG. 4, the resistances of the resistors are set as: R1=50 kΩ, R2=100 kΩ, R3=20 kΩ, and R4=1 kΩ, where the resistances of the thermistors at 25° C. are set as: TH1=2.31 kΩ and TH2=46.2 kΩ, where the B constant of each of the thermistors is set to between about 3000 and about 4000, and where Vcc is set to 3V.

Accordingly, the circuit structure shown in FIG. 4 allows a voltage (potential difference) applied to the varactor diode VD to be in a curve that approximately corresponds to the cubic function. Thus, almost all of the variation in the resonant frequency of the quartz crystal resonator is compensated for.

Consequently, a temperature-compensated piezoelectric oscillator that outputs a high-frequency signal having an approximately constant oscillation frequency without depending on the ambient temperature can be provided with a simpler structure.

A temperature-compensated piezoelectric oscillator according to a fourth preferred embodiment will be described with reference to FIGS. 6 to 8.

Figure 6:
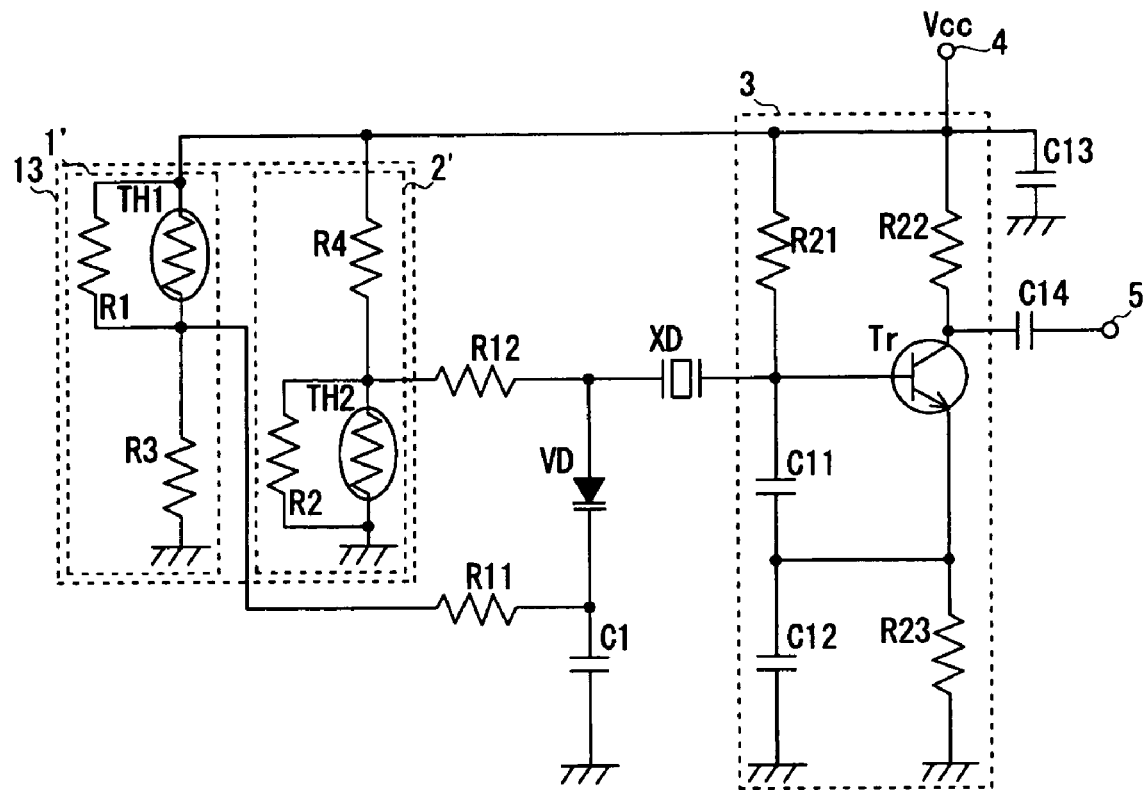
FIG. 6 is an equivalent circuit diagram of a temperature-compensated piezoelectric oscillator according to a fourth preferred embodiment of the present invention.

FIG. 6 is an equivalent circuit diagram of the temperature-compensated piezoelectric oscillator according to this preferred embodiment.

The temperature-compensated piezoelectric oscillator shown in FIG. 6 preferably has the same structure as the temperature-compensated piezoelectric oscillator shown in FIG. 4 with the exception that the second voltage generation circuit 2 of the temperature-compensated piezoelectric oscillator shown in FIG. 4 is replaced with a second voltage generation circuit 2'. In the second voltage generation circuit 2', the Vcc terminal 4 is connected to the resistor R4, the resistor R4 is connected to the parallel circuit including the thermistor TH2 and the resistor R2, and one end of the parallel circuit is grounded. Also, the connection point of the resistor R4 and the parallel circuit is connected to the varactor diode VD via the resistor R12.

With this structure, due to the combination of settings of the element values (impedances) of the elements (the resistors R1 to R4 and the thermistors TH1 and TH2) and the B constants of the thermistors in a temperature compensation voltage generation circuit 13, a negative voltage (a forward bias voltage in terms of the diode) can be applied to the varactor diode VD.

Figure 7:
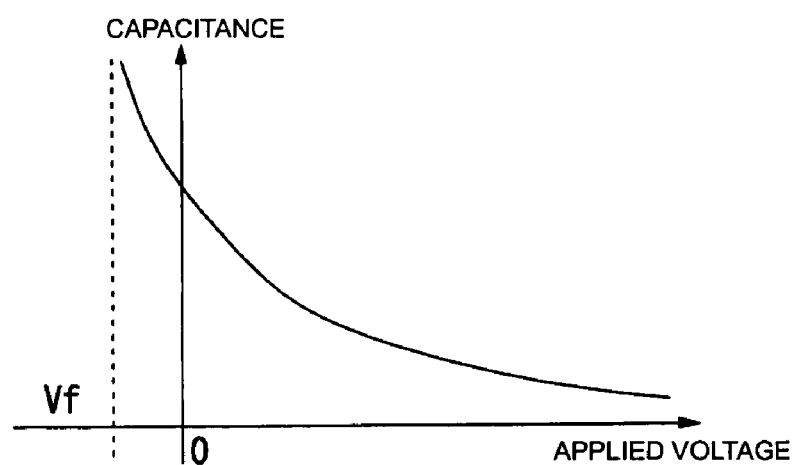
FIG. 7 is a graph showing the applied voltage characteristics of the capacitance of a varactor diode VD.

FIG. 7 is a graph showing the applied voltage characteristics of the capacitance of the varactor diode VD. In this graph, the forward direction of the applied voltage represents a negative direction in terms of the diode characteristics. As shown in this graph, the capacitance of the varactor diode VD increases as the applied voltage is reduced to a negative voltage. This capacitance increases until it reaches a voltage Vf at which a current starts to flow in the diode.

Figure 8:
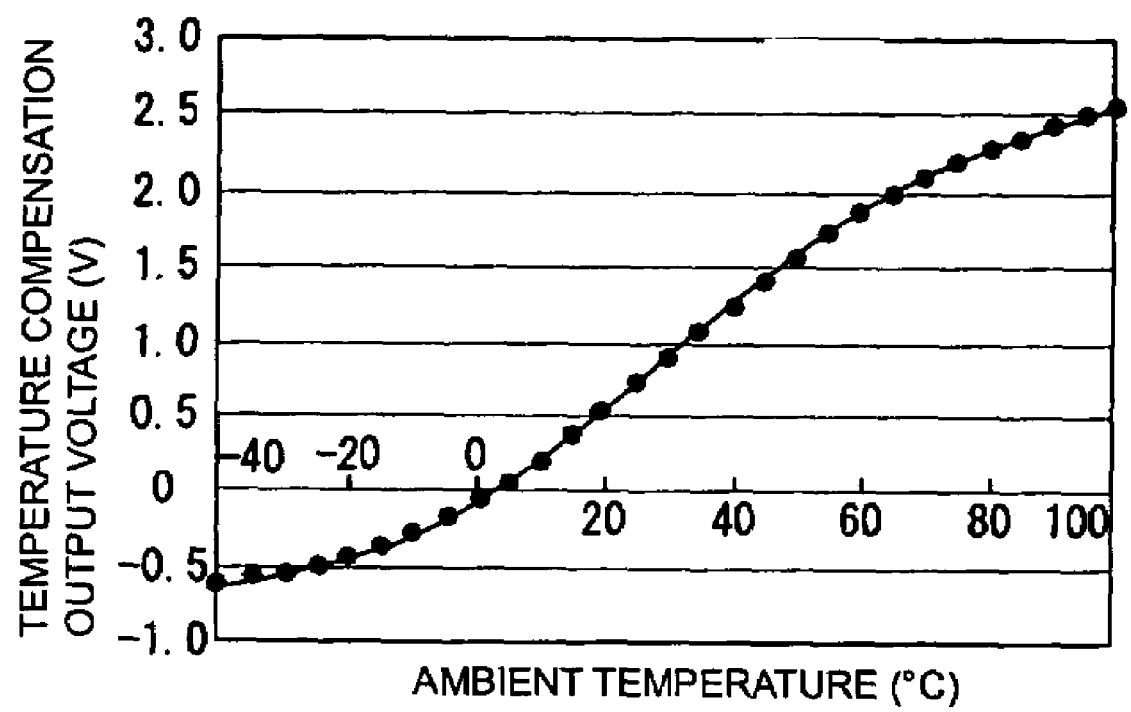
FIG. 8 is a graph showing the temperature dependency of a temperature compensation output voltage (potential difference) of a temperature compensation voltage generation circuit of the temperature-compensated piezoelectric oscillator shown in FIG. 6.

FIG. 8 is a graph showing the temperature dependency of a temperature compensation output voltage (potential difference) of the temperature compensation voltage generation circuit of the temperature-compensated piezoelectric oscillator shown in FIG. 6. FIG. 8 shows simulation results in a case where, in FIG. 6, the resistances of the resistors are set as: R1=50 kΩ, R2=20 kΩ, R3=20 kΩ, and R4=20 kΩ, where the resistances of the thermistors at 25° C. are set as: TH1=23.1 kΩ and TH2=37.0 kΩ, where the B constant of each of the thermistors is set to between about 3000 and about 4000, and where Vcc is set to 3V.

Accordingly, the circuit structure shown in FIG. 6 allows a voltage (potential difference) applied to the varactor diode VD to be in a curve that approximately corresponds to the cubic function, and increases the range of the voltage (potential difference) applied to the varactor diode VD. Thus, almost all of the variation in the resonant frequency is compensated for even if a quartz crystal resonator highly dependent on the temperature, that is, a quartz crystal resonator whose resonant frequency greatly changes depending on the ambient temperature is used.

Consequently, a temperature-compensated piezoelectric oscillator that outputs a high-frequency signal having an approximately constant oscillation frequency without depending on the ambient temperature is provided.

Although a temperature-compensated piezoelectric oscillator including a Colpitts oscillation circuit and an inverter oscillation circuit has been explained in each of the foregoing preferred embodiments, similar advantages can be achieved by using an oscillation circuit, such as a Hartley oscillation circuit, a Pierce oscillation circuit, or a Clapp oscillation circuit. Also, although the oscillation circuit including a bipolar transistor has been explained, a field-effect transistor may be used. In addition, similar advantages can be achieved by using an oscillation circuit including a logic element, such as a C-MOS. Also, similar advantages can be achieved by inserting circuit elements, such as a capacitor and an inductor, in the temperature compensation voltage generation circuit shown in each of the foregoing preferred embodiments. Also, the piezoelectric element is not limited to a quartz crystal resonator. Similar advantages can be achieved by using a surface acoustic wave resonator, a ceramic resonator using bulk resonance, a lithium tantalate resonator, or lithium niobate resonator.

An electronic apparatus according to a fifth preferred embodiment will be described with reference to FIG. 9.

Figure 9:
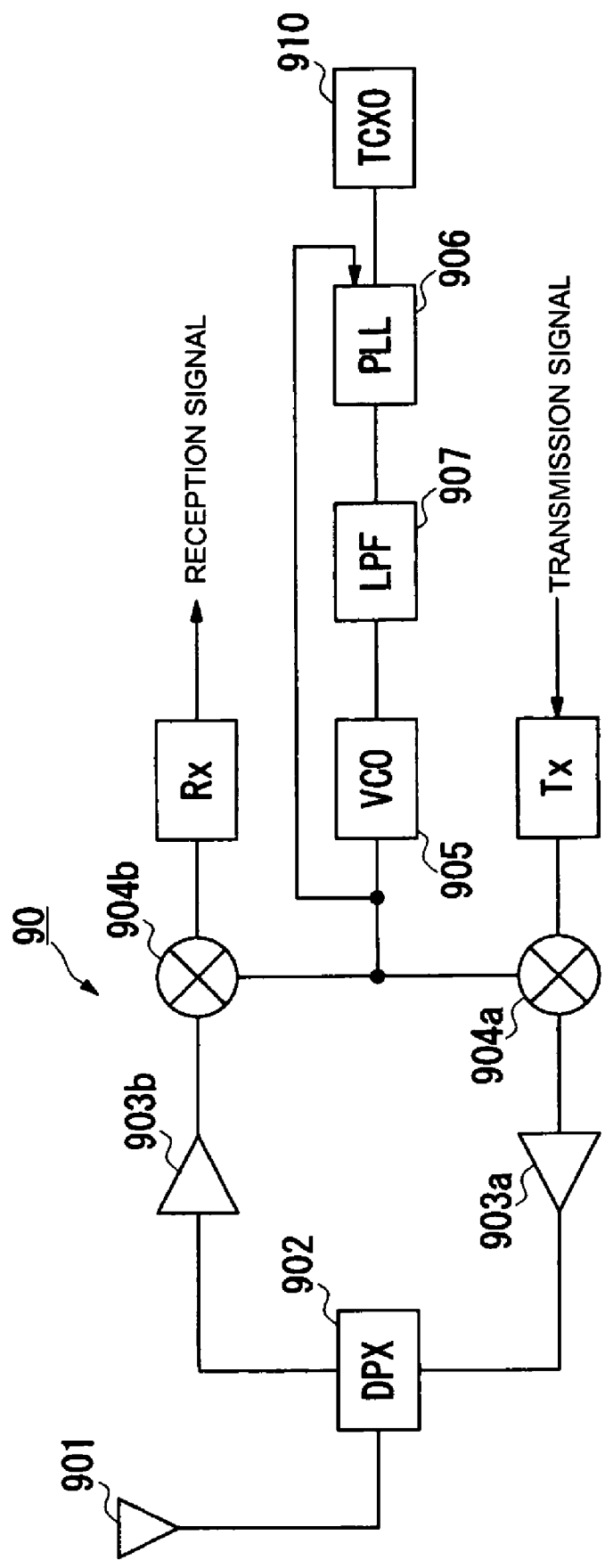
FIG. 9 is a block diagram showing a communication apparatus, which is an example of an electronic apparatus according to a preferred embodiment of the present invention.

FIG. 9 is a block diagram showing a communication apparatus, which is an example of an electronic apparatus.

As shown in FIG. 9, a communication apparatus 90 includes an antenna 901, a duplexer 902, amplifiers 903a and 903b, mixers 904a and 904b, a voltage control oscillator 905, a PLL circuit 906, a low pass filter 907, a temperature-compensated piezoelectric oscillator 910 according to the present invention, a modulator Tx, and a demodulator Rx.

The PLL circuit 906 receives an output signal from the voltage control oscillator 905, compares the phase of the output signal with a division signal of an oscillation signal of the temperature-compensated piezoelectric oscillator 910, and outputs a control voltage such that the voltage control oscillator 905 has a predetermined frequency.

The voltage control oscillator 905 receives the control voltage at a control terminal via the low pass filter 907, and outputs a high-frequency signal corresponding to the control voltage. The high-frequency signal is given to each of the mixers 904a and 904b as a local oscillation signal.

The mixer 904a mixes an intermediate frequency signal and a local oscillation signal output from the modulator Tx, and converts the mixed signal into a transmission signal. The transmission signal is amplified by the amplifier 903a, and is emitted from the antenna 901 via the duplexer 902.

The reception signal received at the antenna 901 is amplified by the amplifier 903b via the duplexer 902. The mixer 904b mixes the reception signal amplified by the amplifier 903b and the local oscillation signal from the voltage control oscillator 905, and converts the mixed signal into an intermediate frequency signal. The intermediate frequency signal is detected by the demodulator Rx.

As described above, the use of the temperature-compensated piezoelectric oscillator 910 shown in each of the foregoing preferred embodiments achieves a compact communication apparatus having excellent communication characteristics. Although the communication apparatus 90 has been explained as an electronic apparatus including the temperature-compensated piezoelectric oscillator according to various preferred embodiments of the present invention, the electronic apparatus according to the present invention is not limited to a communication apparatus.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

The invention claimed is:

1. A temperature-compensated piezoelectric oscillator comprising:
   a piezoelectric element:
   an amplifying circuit connected to a first end of the piezoelectric element;
   a variable capacitance element connected a second end of the piezoelectric element;
   a compensation voltage generation circuit for applying a voltage corresponding to a temperature to the variable capacitance element; and
   a temperature compensation data generation circuit for detecting the ambient temperature and for generating temperature compensation data corresponding to the detected temperature; wherein
   the compensation voltage generation circuit includes a first voltage generation circuit for appling to a first end of the variable capacitance element a first voltage that is variable depending on an ambient temperature and second voltage generation circuit for applying to a second end of the variable capacitance element a second voltage that is variable depending on the ambient temperature in a direction opposite to the first voltage; and
   each of the first and second voltage generation circuits includes a DA converter arranged to convert the temperature compensation data in a digital format into an analog signal.

2. The temperature-compensated piezoelectric oscillator according to claim 1, wherein the piezoelectric element is an AT-cut quartz crystal resonator.

3. The temperature-compensated piezoelectric oscillator according to claim 1, wherein the variable capacitance element is a varactor diode.

4. A temperature-compensated piezoelectric oscillator comprising:
   a piezoelectric element;
   an ammplifying circuit connected to a first end of the piezoelectric element;
   a variable capacitance element connected a second end of the piezoelectric element; and
   a compensation voltage generation circuit for applying a voltage corresponding to a temperature to the variable capacitance element; wherein
   the compensation voltage cieneration circuit includes a first voltage generation circuit for applying to a first end of the variable capacitance element a first voltage that is variable depending on an ambient temperature and second voltacie cieneration circuit for applying to a second end of the variable capacitance element a second voltage that is variable deDendinQ on the ambient temDerature in a direction opposite to the first voltage:
   the variable capacitance element is a varactor diode; and
   an anode of the varactor diode is connected to the piezoelectric element and a cathode of the varactor diode is grounded via a high-frequency bypass capacitor.

5. A temperature-compensated piezoelectric oscillator comprising:
   a piezoelectric element:
   an amplified circuit connected to a first end of the piezoelectric element
   a variable capacitance element connected a second end of the piezoelectric element; and
   a compensation voltage generation circuit for appplying a voltage corresponding to a temperature to the variable capacitance element; wherein
   the copensation voltage generation circuit includes a first voltage generation circuit for applying to a first end of the variable capacitance element a first voltage that is variable depending on an ambient temperature and second voltage generation circuit for applying to a second end of the variable capacitance element a second voltage that is variable depending on the ambient temperature in a direction opposite to the first voltage; and
   the amplifying circuit includes an NPN transistor, a plurality of resistors and at least one capacitor.

6. The temperature-compensated piezoelectric oscillator according to claim 5, wherein a base of the NPN transistor is connected to the piezoelectric element, a collector of the NPN transistor is connected a terminal of the temperature-compensated piezoelectric oscillator via one of the plurality of resistors, and an emitter of the NPN transistor is grounded via another of the plurality of resistors and the at least one capacitor.

7. An electronic apparatus comprising the temperature-compensated piezoelectric oscillator as set forth in claim 1.

8. An electronic apparatus comprising:
   a temperature-compensated piezoelectric oscillator comprising:
   a piezoelectric element;
   an amplifying circuit connected to a first end of the piezoelectric element:
   a variable capacitance element connected a second end of the piezoelectric element; and
   a compensation voltage generation circuit for applying a voltage corresponding to a temperature to the variable capacitance element; wherein the compensation voltage generation circuit includes a first voltage generation circuit for applying to a first end of the variable capacitance element a first voltage that is variable depending on an ambient temperature and second voltage generation circuit for applying to a second end of the variable capacitance element a second voltage that is variable dependincg on the ambient temperature in a direction opposite to the first voltage;

an antenna;

a duplexer connected to the antenna;

a plurality of amplifiers connected to the duplexer;

a plurality of mixers, each being connected to a respective one of the plurality of amplifiers;

a voltage control oscillator connected to said plurality of mixers; and a PLL circuit and a low pass filter connected to the voltage control oscillator; wherein said temperature-compensated piezoelectric oscillator is connected to said the voltage control oscillator.

9. The temperature-compensated piezoelectric oscillator according to claim 4, wherein each of the first and second voltage generation circuits includes at least one thermo-sensitive element and a plurality of resistance elements.

10. The temperature-compensated piezoelectric oscillator according to claim 4, wherein each of the first and second voltage generation circuits includes a parallel circuit connected to a terminal of the temperature-compensated piezoelectric oscillator and includes a first thermo-sensitive element and a first resistance element, a second thermo-sensitive element and a second resistance element connected in series to said parallel circuit, one end of said second thermo-sensitive element being grounded.

11. The temperature-compensated piezoelectric oscillator according to claim 4, wherein each of the first and second voltage generation circuits includes a thermo-sensitive element and a first resistance element connected in parallel to define a parallel circuit and a second resistance element connected in series to the parallel circuit.

12. The temperature-compensated piezoelectric oscillator according to claim 11, wherein the thermo-sensitive element is a thermistor.

13. The temperature-compensated piezoelectric oscillator according to claim 4, wherein the piezoelectric element is an AT-cut quartz crystal resonator.

14. The temperature-compensated piezoelectric oscillator according to claim 5, wherein each of the first and second voltage generation circuits includes at least one thermo-sensitive element and a plurality of resistance elements.

15. The temperature-compensated piezoelectric oscillator according to claim 5, wherein each of the first and second voltage generation circuits includes a parallel circuit connected to a terminal of the temperature-compensated piezoelectric oscillator and includes a first thermo-sensitive element and a first resistance element, a second thermo-sensitive element and a second resistance element connected in series to said parallel circuit, one end of said second thermo-sensitive element being grounded.

16. The temperature-compensated piezoelectric oscillator according to claim 5, wherein each of the first and second voltage generation circuits includes a thermo-sensitive element and a first resistance element connected in parallel to define a parallel circuit and a second resistance element connected in series to the parallel circuit.

17. The temperature-compensated piezoelectric oscillator according to claim 16, wherein the thermo-sensitive element is a thermistor.

18. The temperature-compensated piezoelectric oscillator according to claim 5, wherein the piezoelectric element is an AT-cut quartz crystal resonator.

19. The temperature-compensated piezoelectric oscillator according to claim 5, wherein the variable capacitance element is a varactor diode.

20. The temperature-compensated piezoelectric oscillator according to claim 1, wherein each of the first and second voltage generation circuits includes at least one thermo-sensitive element and a plurality of resistance elements.

21. The temperature-compensated piezoelectric oscillator according to claim 1, wherein each of the first and second voltage generation circuits includes a parallel circuit connected to a terminal of the temperature-compensated piezoelectric oscillator and includes a first thermo-sensitive element and a first resistance element, a second thermo-sensitive element and a second resistance element connected in series to said parallel circuit, one end of said second thermo-sensitive element being grounded.

22. The temperature-compensated piezoelectric oscillator according to claim 1, wherein each of the first and second voltage generation circuits includes a thermo-sensitive element and a first resistance element connected in parallel to define a parallel circuit and a second resistance element connected in series to the parallel circuit.

23. The temperature-compensated piezoelectric oscillator according to claim 20, wherein the thermo-sensitive element is a thermistor.

* * * * *